(12) United States Patent
Holzmann et al.

(10) Patent No.: US 9,007,775 B2
(45) Date of Patent: Apr. 14, 2015

(54) LABELING OF HARDWARE MODULES

(71) Applicants: Gottfried Holzmann, Zorneding (DE); Werner Mittermaier, Erding (DE)

(72) Inventors: Gottfried Holzmann, Zorneding (DE); Werner Mittermaier, Erding (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 257 days.

(21) Appl. No.: 13/662,573

(22) Filed: Oct. 29, 2012

(65) Prior Publication Data

US 2014/0119014 A1    May 1, 2014

(51) Int. Cl.
*H05K 7/00* (2006.01)
*H05K 5/00* (2006.01)
*H05K 7/14* (2006.01)

(52) U.S. Cl.
CPC .............. *H05K 7/1431* (2013.01); *H05K 5/00* (2013.01)

(58) Field of Classification Search
CPC ..... H05K 5/00; H05K 5/0021; H05K 5/0026; H05K 5/0065; H05K 5/0256; H05K 7/023; H05K 7/1428; H05K 7/1431
USPC ............... 362/311.02, 222, 223, 307, 311.01, 362/351, 249.02; 361/730, 600, 679.01, 361/679.02, 728, 729, 736; 174/50, 50.52, 174/520, 559, 560, 59; 312/223.2
See application file for complete search history.

(56) References Cited

U.S. PATENT DOCUMENTS

| | | | | |
|---|---|---|---|---|
| 4,080,028 A | * | 3/1978 | Gilbert | 439/62 |
| 5,358,367 A | * | 10/1994 | Yang | 411/397 |
| 5,896,273 A | * | 4/1999 | Varghese et al. | 361/724 |
| 5,990,981 A | * | 11/1999 | Thompson et al. | 348/705 |
| 6,144,561 A | * | 11/2000 | Cannella et al. | 361/796 |
| 6,311,229 B1 | * | 10/2001 | Burchard et al. | 710/2 |
| 6,680,852 B1 | * | 1/2004 | Wortman | 361/752 |
| 7,234,964 B1 | * | 6/2007 | Karstens | 439/490 |

* cited by examiner

*Primary Examiner* — Angel R Estrada
*Assistant Examiner* — Dimary Lopez Cruz
(74) *Attorney, Agent, or Firm* — Ditthavong & Steiner, P.C.

(57) ABSTRACT

A housing for electronic components comprising at least one hardware module and a frame. The hardware module comprises a mounting element, wherein the frame connects the at least one hardware module through the mounting element mechanically stable to the housing. A labeling element is attached to the mounting element and the housing has at least one viewing opening so that at least one part of the labeling element can be seen from the outside of the housing.

10 Claims, 4 Drawing Sheets

LABELING OF HARDWARE MODULES

BACKGROUND OF THE INVENTION

1. Field of the Invention

The present invention relates to a housing comprising at least one hardware module, wherein a labeling element is attached to the at least one hardware module. The labeling element can be seen from the outside of the housing thereby allowing that the type of the at least one hardware module can be identified easily.

2. Discussion of the Background

It is a known problem that a housing comprises for example a plurality of different hardware modules, wherein the different hardware modules all look the same from the front side, so that a person cannot tell what kind of hardware module is inserted into the respective slot of the housing. Document U.S. 2009/0236909 A1 describes an adaptive power strip. In FIG. 24 it is shown that the housing of the adaptive power strip comprises color codes in order to indicate whether the adaptive power strip is considered for North American or European power standards for example. However, document U.S. 2009/0236909 A1 does not deal with the fact that false electronic components may accidently be applied during assembly than indicated by the color codes.

SUMMARY OF THE INVENTION

The embodiments of the present invention advantageously provide a housing having at least one hardware module and a labeling element that allows identifying the type of the hardware module from the outside of the housing.

The inventive housing comprises at least one hardware module and a frame, wherein the hardware module comprises a mounting element, wherein the frame connects the at least one hardware module through the mounting element mechanically stable to the housing, wherein a labeling element is attached to the mounting element and wherein the housing has at least one viewing opening so that at least one part of the labeling element can be seen from the outside of the housing.

It is very advantageous that a labeling element is attached to a mounting element and therefore to the respective hardware module. This labeling element is attached during the assembly of the hardware module itself and not during the assembly of the housing comprising the plurality of the hardware modules. Therefore, the possibility that a false labeling element is added to the housing is reduced. It is also beneficial that the respective labeling element can be seen through a viewing opening within the housing from the outside of the housing, so that no special front panels or the like has to be assembled. For example if a housing may contain three different hardware modules, wherein each of the three different hardware modules does not use a fixed slot within the housing, a plurality of front panels has to be designed in order to cover all permutations of the different arrangements of the hardware modules.

It is also very beneficial if a body portion of the labeling element and a first attachment opening of the mounting element have a screw thread and are screwed together, because this assures that the labeling element can be attached very easily to the mounting element during the assembly of the hardware module.

It is also very advantageous if the housing comprises a plurality of hardware modules, wherein at least some of the hardware modules are of a different type, wherein the labeling elements within the respective hardware modules of the same type have the same color and shape and wherein the labeling elements within the respective hardware modules of a different type differ in color and/or shape from each other. This assures that the different type of hardware modules can be identified very easily without opening the housing or without taking a deeper look at the product number normally shown at the rear side. The hardware modules can also be identified without having them powered up.

Last but not least it is very beneficial if the housing further comprises a front panel, wherein the front panel is attached to the frame and wherein the front panel comprises the at least one viewing opening, wherein the head portion of the labeling element fits into the at least one viewing opening and wherein the head portion of the labeling element is flush with the front panel. This allows that only one type of front panels has to be designed, wherein the type of the respective hardware module can still be determined easily and wherein the different types of hardware modules can be arranged within the slots of the housing in any order. Since the head portion of the labeling element is flush with the front panel, there also occur no difficulties during the assembly of the housing in the production environment. It is therefore also beneficial that the hardware modules can be changed, wherein the labeling element also changes automatically. This ensures that always the proper labeling element indicates the inserted hardware module. Thus no sticker or anything else is required or has to be updated to indicate the type of the inserted hardware modules.

BRIEF DESCRIPTION OF THE DRAWINGS

Different embodiments of the present invention are described exemplary in the following in reference to the drawings. This is done by the way of example without limitation. The same feature has always the same reference signs. The figures in the drawings show in detail.

DETAILED DESCRIPTION OF EXEMPLARY EMBODIMENTS OF THE INVENTION

In the following some preferred embodiments of the present invention are described in detail.

Figure 1:
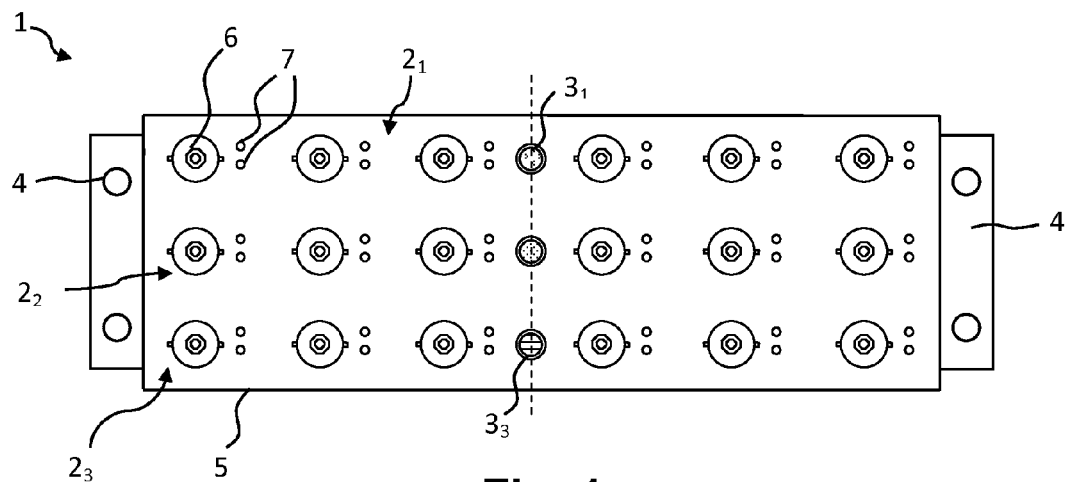
FIG. 1 a front view of the housing comprising a plurality of hardware modules each of them having a labeling element according to the present invention.

FIG. 1 shows a front view of the housing 1 comprising a plurality of hardware modules $2_1$, $2_2$, $2_3$, each of them having a labeling element $3_1$, $3_2$, $3_3$ according to the present invention. The housing 1 has also two fasteners 4 for fastening the housing into a 19-inch rack for example. Furthermore, a front panel 5 is shown which covers a plurality of the hardware modules $2_1$, $2_2$, $2_3$. The front panel 5 has also a plurality of recesses allowing the various connectors from the hardware modules $2_1$, $2_2$, $2_3$ to be fed through. In the embodiment of FIG. 1 each hardware module $2_1$, $2_2$, $2_3$ looks the same. Each hardware module $2_1$, $2_2$, $2_3$ has a plurality of connectors, for example high frequency connectors 6 as well as plurality of LED's (light emission diode) 7, wherein in each case two of the LED's 7 are arranged adjacent to the respective high frequency connector 6 indicating whether the high frequency connector 6 is used as an input port or an output port.

The hardware modules $2_1$, $2_2$, $2_3$ have the same amount of connectors 6 and LED's 7 and therefore look the same, but they may serve a different purpose. For example the housing 1 of FIG. 1 may be used as a switching matrix, wherein the hardware modules $2_1$, $2_2$, $2_3$ may differ in their switching path or in their absolute input-output-power. In order to identify the different hardware modules $2_1$, $2_2$, $2_3$, each hardware module $2_1$, $2_2$, $2_3$ comprises one labeling element $3_1$, $3_2$, $3_3$. Different hardware modules $2_1$, $2_2$, $2_3$ have therefore different labeling elements $3_1$, $3_2$, $3_3$. The labeling elements $3_1$, $3_2$, $3_3$ may differ in color and/or shape and/or pattern for example. Within FIG. 1 the use of different labeling elements $3_1$, $3_2$, $3_3$ is indicated by using a different pattern. If the housing 1 comprises hardware modules $2_1$, $2_2$, $2_3$ which are of the same type, then they also have the same labeling elements $3_1$, $3_2$, $3_3$ which do not differ in color and shape and pattern. The labeling elements $3_1$, $3_2$, $3_3$ can be seen from the outside of the housing 1. More precisely at least one part of the labeling elements $3_1$, $3_2$, $3_3$ can be seen from the outside of the housing 1. The labeling elements $3_1$, $3_2$, $3_3$ allow that the respective hardware module $2_1$, $2_2$, $2_3$ can be identified, even if the hardware modules $2_1$, $2_2$, $2_3$ are not powered on. Furthermore, an individual front panel 5 is not needed.

Figure 2A:
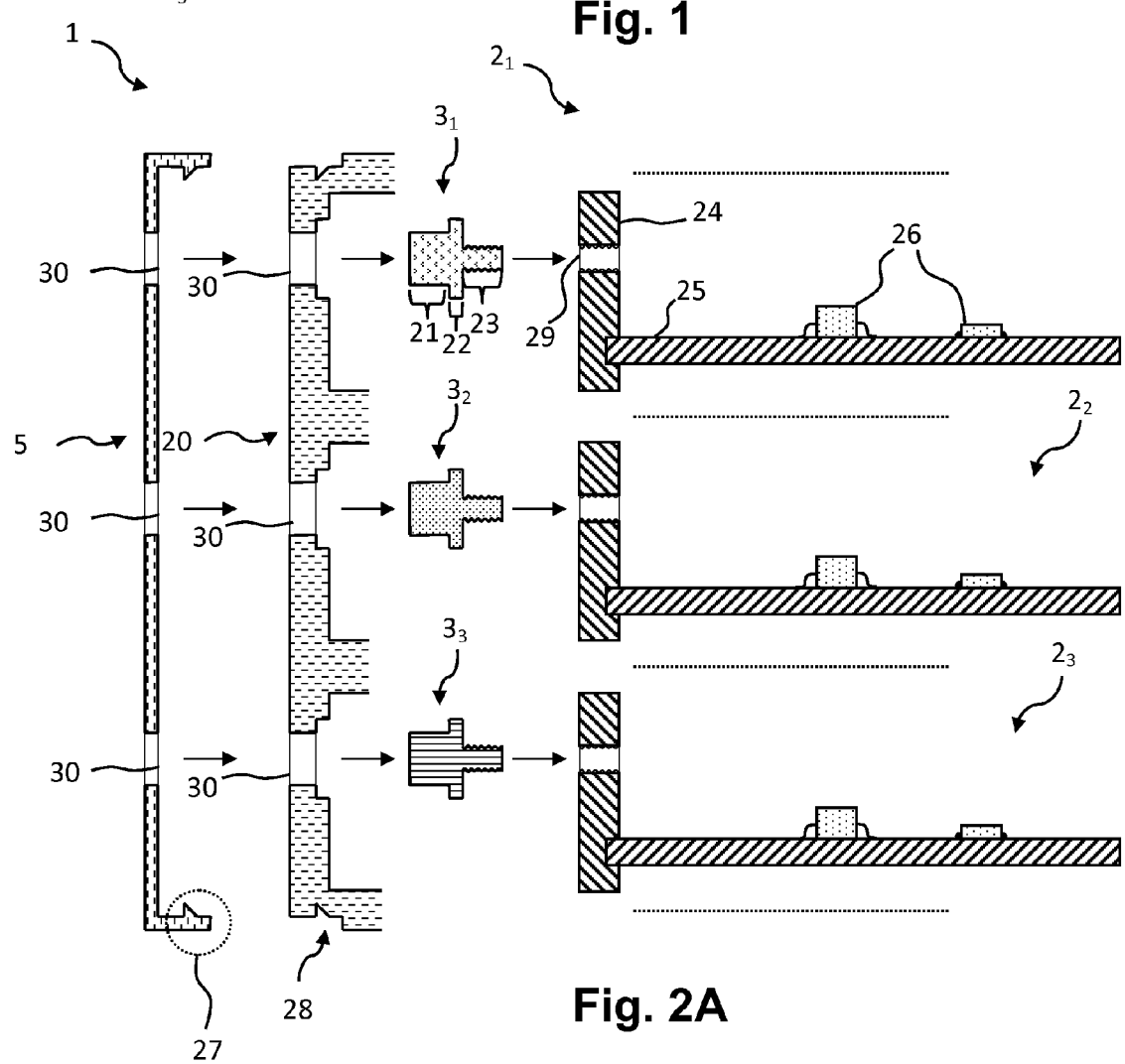
FIG. 2A a cross sectional view through the housing describing the use of the labeling elements according to one embodiment of the present invention.

FIG. 2A shows a cross-sectional view along the dashed line in FIG. 1 through the housing 1 describing the use of the labeling elements $3_1$, $3_2$, $3_3$ according to one embodiment of the present invention. The housing 1 comprises a front panel 5, a frame 20, the labeling elements $3_1$, $3_2$, $3_3$ as well as at least one hardware module $2_1$, $2_2$, $2_3$. The at least one hardware module $2_1$, $2_2$, $2_3$ comprises a mounting element 24 and a printed circuit board 25. The printed circuit board 25 has also a plurality of surface mounted devices 26.

The mounting element 24 of each hardware module $2_1$, $2_2$, $2_3$ is attached mechanically stable to the printed circuit board 25, for example using a screwed fastening which is not shown in FIG. 2A. The mounting element 24 has also a first attachment opening 29 which has the form of a through-hole. The first attachment opening 29 has also a screw-thread at the inner wall.

FIG. 2A also shows the labeling element $3_1$, $3_2$, $3_3$ which has the form of a bolt or a screw having a head portion 21 and at least a body portion 23. The body portion 23 of the respective labeling element $3_2$, $3_2$, $3_3$ has a screw-thread and can be inserted into the first attachment opening 29 of the mounting element 24 of the respective hardware module $2_2$, $2_2$, $2_3$. The labeling element $3_1$, $3_2$, $3_3$ has a middle portion 22 between the head portion 21 and the body portion 23. The diameter of the middle portion 22 is larger than the diameter of the head portion 21 and/or the body portion 23. The width of the middle portion 22 is preferably smaller than the width of the head portion 21 and/or the width of the body portion 23. The labeling element $3_1$, $3_2$, $3_3$ having a head portion 21, a body portion 23 and optionally a middle portion 22 is made in one-piece with a milling process or a pressing process.

The labeling elements $3_1$, $3_2$, $3_3$ shown in FIG. 2A have a different pattern. The pattern, the color and/or the shape of at least the head portion 21 of the labeling elements $3_1$, $3_2$, $3_3$ differ with respect to the type of the respective hardware modules $2_1$, $2_2$, $2_3$ they are connected to. Labeling elements $3_1$, $3_2$, $3_3$ that are connected to hardware modules $2_1$, $2_2$, $2_3$ of the same type have the same color and shape and pattern. However, if the labeling elements $3_1$, $3_2$, $3_3$ are connected to hardware modules $2_1$, $2_2$, $2_3$ of a different type, they also differ in color and/or shape and/or pattern from each other. As can be seen in FIG. 2A, the housing 1 comprises a plurality of hardware modules $2_1$, $2_2$, $2_3$, wherein the housing 1 comprises a plurality of different hardware modules $2_1$, $2_2$, $2_3$ or similar hardware modules $2_1$, $2_2$, $2_3$.

It can also be seen that the housing 1 has at least one viewing opening 30. More precisely, the frame 20 has at least one viewing opening 30 for each of the labeling elements $3_1$, $3_2$, $3_3$. The diameter of the at least one viewing opening 30 of the frame 20 equals at least to the diameter of the head portion 21 of the respective labeling element $3_1$, $3_2$, $3_3$. It can further be seen that the front panel 5 has at least one viewing opening 30. The diameter of the viewing opening 30 of the front panel 5 equals at least to the diameter of the head portion 21 of the respective labeling element $3_1$, $3_2$, $3_3$. The cross section of the viewing opening 30 is preferably a circle. The center of the circle of the viewing opening 30 of the frame 5 is directly over the center of the viewing opening 30 of the frame 20.

The frame 5 has also a hook 27 that fits into an eye 28 of the frame 20 in order to attach the front panel 5 mechanically stable to the frame 20 and therefore to the housing 1. The front panel 5, the frame 20, the labeling elements $3_1$, $3_2$, $3_3$ as well as the hardware modules $2_1$, $2_2$, $2_3$ are connected together as indicated by the arrows. The dotted lines indicate a possible form for the frame 20.

Figure 2B:
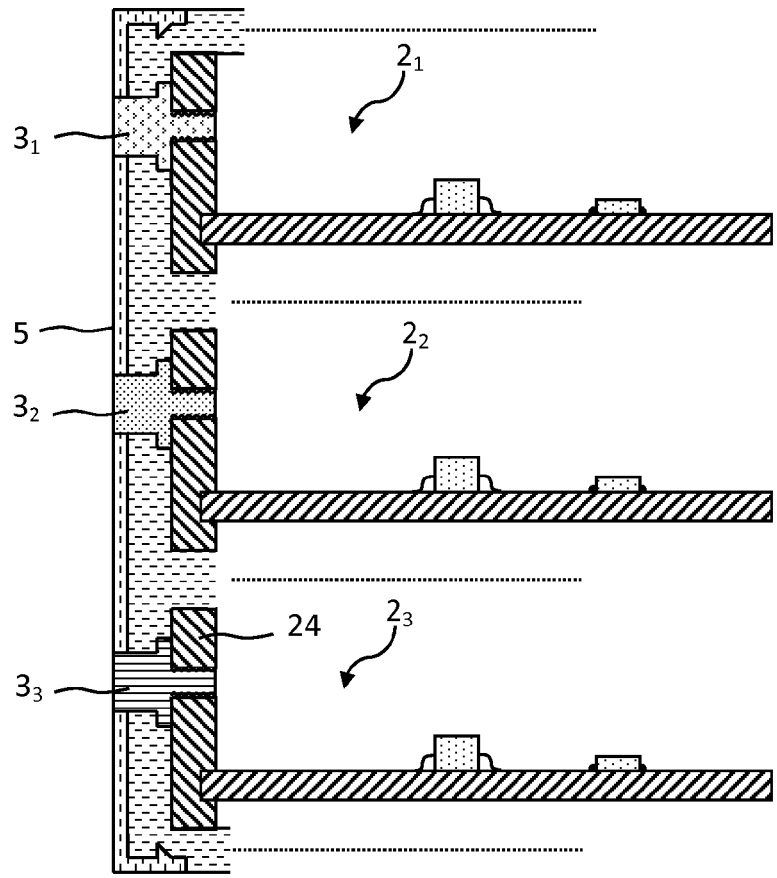
FIG. 2B another cross sectional view through the housing describing the use of the labeling elements according to one embodiment of the present invention.

FIG. 2B shows another cross sectional view through the housing 1 describing the use of the labeling elements $3_1$, $3_2$, $3_3$ according to one embodiment of the present invention. FIG. 2B shows the mounted housing 1. It can be seen that the body portion 21 of the labeling element $3_1$, $3_2$, $3_3$ having a screw thread is screwed together with the first attachment opening 29 of the mounting element 24 also having a screw thread. During assembly, the printed circuit board 25 is mounted mechanically stable to respective mounting element 24. Furthermore, the respective labeling element $3_1$, $3_2$, $3_3$ is mounted to the first attachment opening 29 of the mounting element 24. According to the type of the respective hardware module $2_1$, $2_2$, $2_3$ the proper labeling element having the proper color and/or shape and/or pattern is mounted to the mounting element 24. After that, the hardware module $2_1$, $2_2$, $2_3$ together with the respective labeling elements $3_1$, $3_2$, $3_3$ is mounted to the frame 20. After all, the front panel 5 is attached to the frame 20 therefore completing the assembly of the housing 1.

It has to be noted that the first attachment opening 29 has a diameter that is small enough, so that the hardware modules $2_1$, $2_2$, $2_3$ fulfill the EMC-Standard (Electromagnetic Compatibility) in compliance with the CE-Test (fr. Conformité Européenne; engl. European Conformity) for example. It can also be seen that the top of the head portion 21 of the labeling element $3_1$, $3_2$, $3_3$ is flush with the front panel 5. However, the labeling elements $3_1$, $3_2$, $3_3$ can be seen from the outside of the housing 1 allowing a user to identify the hardware modules $2_1$, $2_2$, $2_3$. Because the labeling elements $3_1$, $3_2$, $3_3$ are connected to the hardware modules $2_1$, $2_2$, $2_3$ during the assembly of the hardware modules $2_1$, $2_2$, $2_3$, no customer front panels 5 have to be used in accordance with the assembly of the housing 1. The possibility that a false sticker is attached to the front panel 5 indicating the wrong type of hardware module $2_1$, $2_2$, $2_3$ is thereby reduced.

Figure 3A:
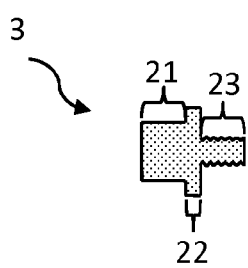
FIG. 3A a cross section through a side view of the labeling element according to one embodiment of the present invention.

FIG. 3A shows a cross section through a side view of the labeling element 3 according to one embodiment of the present invention. As already described, the labeling element 3 has a head portion 21, a middle portion 22 and a body portion 23, wherein the body portion 23 comprises a screw thread.

Figure 3B:
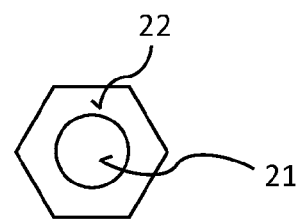
FIG. 3B a top view of the labeling element according to one embodiment of the present invention.

FIG. 3B shows a top view of the labeling element 3 according to one embodiment of the present invention. As can be seen the head portion 21 has the form of a circle as a cross section. Furthermore, the middle portion 22 has a cross section that has the form of a hexagon or an octagon for fitting into a ring wrench. The width of the head portion 21 should be chosen in such a way that the middle portion 22 still fits into the ring wrench. This allows that the labeling element 3 can be screwed very easily into the mounting element 24.

Figure 4A:
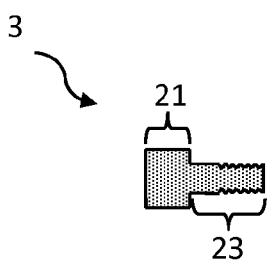
FIG. 4A a cross section through a side view of the labeling element according to another embodiment of the present invention.

FIG. 4A shows another cross section through a side view of another labeling element 3 according to another embodiment of the present invention. The labeling element 3 shown in FIG. 4A has the form of a screw having a head portion 21 and a body portion 23. The diameter of the head portion 21 is larger than the diameter of the body portion 23. As shown at least one part of the body portion 23 has a screw thread.

Figure 4B:
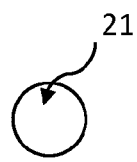
FIG. 4B a top view of the labeling element according to another embodiment of the present invention.

FIG. 4B shows a top view of the labeling element 3 shown in FIG. 4A according to an embodiment of the present invention. As can be seen, the cross section of the head portion 21 has the form of a circle.

Figure 4C:
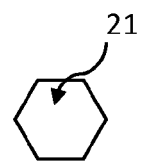
FIG. 4C a top view of the labeling element according to yet another embodiment of the present invention.

FIG. 4C shows a top view of the labeling element 3 of FIG. 4A according to an embodiment of the present invention. As can be seen the cross section of the head portion 21 has the form of a hexagon. However, it has to be noted that by using forms like a hexagon or an octagon the head portion 21 has to fit into the viewing opening 30 of the frame 20 and the front panel 5.

Figure 5A:
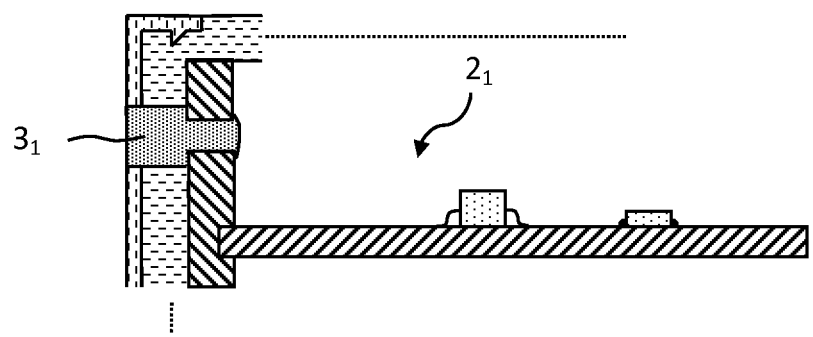
FIG. 5A a cross sectional view through the housing describing the use of the labeling element according to one embodiment of the present invention.

FIG. 5A shows a cross sectional view through the housing 1 describing the use of the labeling elements $3_1$, $3_2$, $3_3$ according to one embodiment of the present invention. As can be seen the labeling element $3_1$ in FIG. 5A has the form of a screw. Within FIG. 5A the first attachment opening 29 is a through hole and a part of the body portion 23 of the labeling element $3_1$ extends out of a first end of the first attachment opening 29, wherein the first end is that end that is further away from the head portion 21 of the labeling element $3_1$ than from the body portion 23 of the labeling element $3_1$. This part of the body portion 23 of the labeling element $3_1$ is riveted with the mounting element 24. It can also be seen that the width of the head portion 21 of the labeling element $3_1$ is as large as the width of the front panel 5 and the frame 20.

Figure 5B:
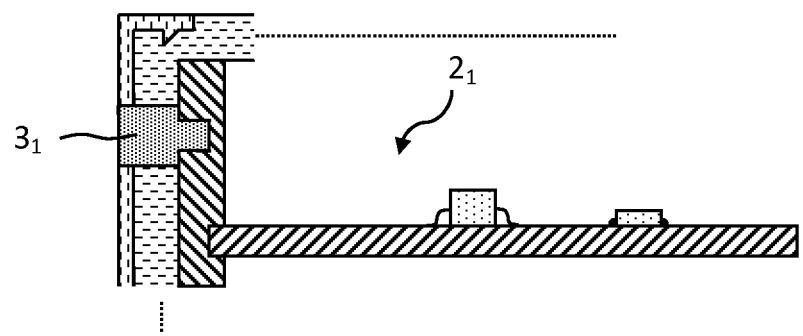
FIG. 5B another cross sectional view through the housing describing the use of the labeling element according to another embodiment of the present invention.

FIG. 5B shows another cross sectional view through the housing 1 describing the use of the labeling element $3_1$ according to one embodiment of the present invention. It can be seen that the first attachment opening 29 is a blind hole. This further increases the compliance with the EMC-Standard. The body portion 23 of the labeling element $3_1$ has a smaller width compared to the body portion 23 of the labeling element $3_1$ in FIG. 5A. The body portion 23 of the labeling element $3_1$ in FIG. 5B has also screw threads and is screwed into the first attachment opening 29 having also a screw thread.

Figure 5C:
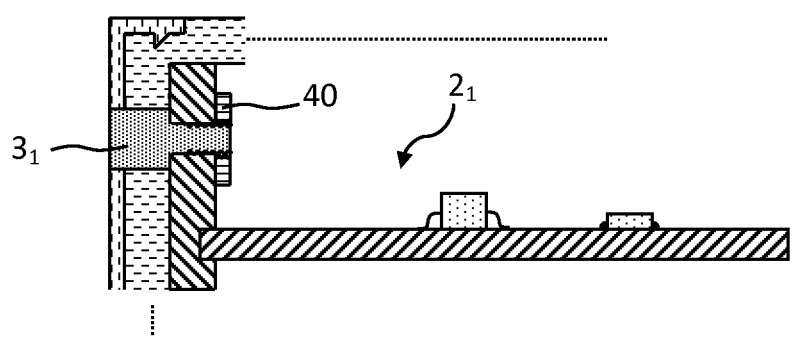
FIG. 5C another cross sectional view through the housing describing the use of the labeling element according to yet another embodiment of the present invention.

FIG. 5C shows another cross sectional view through the housing 1 describing the use of the labeling element $3_1$ according to one embodiment of the present invention. The labeling element $3_1$ has also the form of a screw having only a head portion 21 and a body portion 23. The first attachment opening 29 is a through hole and the part of the body portion 23 of the labeling element $3_1$ extends out of a first end of the first attachment opening 29, wherein the first end is that end that is further away from the head portion 21 of the labeling element $3_1$ than from the body portion 23 of the labeling element $3_1$ and wherein at least this part (extending part) of the body portion 23 has a screw thread and wherein a nut 40 attaches this part of the labeling element $3_1$ to the mounting element 24.

Figure 6:
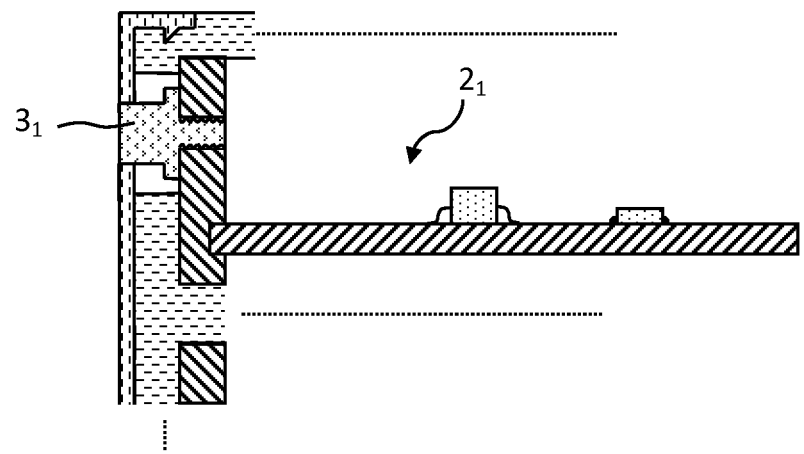
FIG. 6 another cross sectional view through the housing describing the use of the labeling element according to one embodiment of the present invention.

FIG. 6 shows another cross sectional view through the housing 1 describing the use of the labeling element $3_1$ according to one embodiment of the present invention. It can be seen that the labeling element $3_1$ has a head portion 21, and a middle portion 22, wherein the head portion 21 and the middle portion 22 are not surrounded directly by the frame 20. After removing the front panel 5 it is possible to remove the labeling element $3_1$ by screwing it out, without disconnecting the respective hardware module $2_1$ from the frame 20. It can also be seen that the head portion of the labeling element $3_1$ is flush with the front panel 5.

Figure 7:
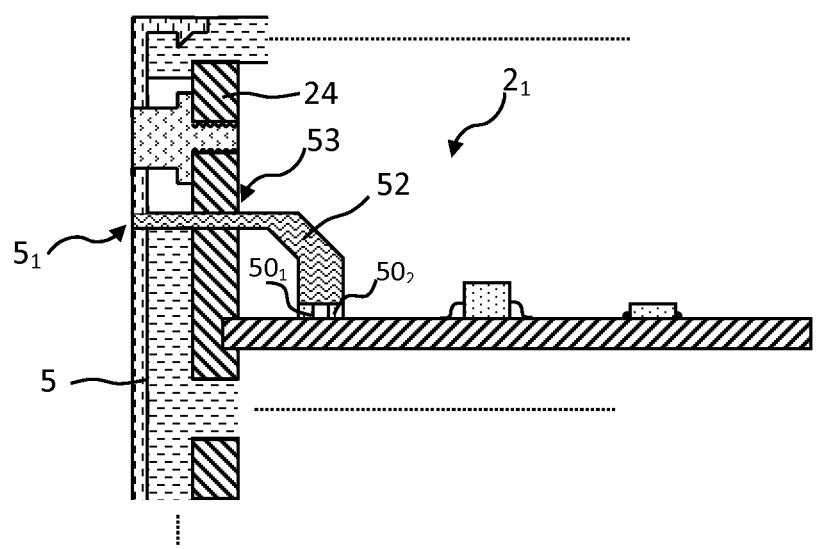
FIG. 7 another cross sectional view through the housing describing the use of the labeling element and a LED according to another embodiment of the present invention.

FIG. 7 shows another cross sectional view through the housing 1 describing the use of the labeling element $3_1$ and a plurality of LED's $50_1$, $50_2$ according to one embodiment of the present invention. It can be seen that the printed circuit board 25 comprises a first LED $50_1$ and for example a second LED $50_2$. It is also possible that the printed circuit board comprises more or less than the two LED's $50_1$, $50_2$. The front panel 5 also comprises another viewing opening 51. Furthermore, a L-shaped structure 52 can be seen in FIG. 7. A first end of the L-shaped structure 52 is placed on the at least one LED $50_1$, $50_2$. With respect to FIG. 7 one end of the L-shaped structure is placed on both of the LED's $50_1$, $50_2$. A second end of the L-shaped structure 52 is led through a second attachment opening 53 of the mounting element 24. This second end of the L-shaped structure 52 fits into the another viewing opening 51 and is flush with the front panel 5.

The L-shaped structure is made of a transparent medium like PMMA for example. The light emitted by the at least one LED $50_1$, $50_2$ is preferably conducted to have an angle of for example 90 degree so that a user can see from the outside of the housing 1 whether the first LED $50_1$ or the second LED $50_2$ or both LED's $50_1$, $50_2$ are turned on. By using two different LED's $50_1$, $50_2$ it is possible to identify three different types of hardware modules $3_1$, $3_2$, $3_3$. Therefore by using the labeling element $3_1$, $3_2$, $3_3$ together with the L-shaped structure 52 and the LED's $50_1$, $50_2$ it is possible for a user to identify the type of the respective hardware module $2_1$, $2_2$, $2_3$ easily if the hardware modules $2_1$, $2_2$, $2_3$ are powered on and it is also possible for the user to identify the type of the hardware module $2_1$, $2_2$, $2_3$ if the respective hardware module $2_1$, $2_2$, $2_3$ is powered off. It is very beneficial that it is not possible to change the labeling element $3_1, 3_2, 3_3$ or the color of the first and second LED $50_1, 50_2$ without opening the housing 1. This ensures that the type of the hardware module $2_1, 2_2, 2_3$ can be identified very precisely.

It is also possible that the hardware modules $2_1, 2_2, 2_3$ are connected to the frame 20 in such a manner that the frame 20 does not need a viewing opening 30. This can be achieved for example, when the frame 20 is arranged only over and/or underneath the hardware modules $2_1, 2_2, 2_3$. Furthermore, the plurality of the hardware modules $2_1, 2_2, 2_3$ can be arranged one upon the other and/or side by side. Furthermore, all features shown above can be combined together in any order.

What is claimed is:

1. A housing comprising:
   at least one hardware module and a frame,
   a front panel covering the at least one hardware module,
   wherein the frame is attached to the front panel,
   wherein the at least one hardware module includes a mounting element,
   wherein the frame connects the at least one hardware module through the mounting element,
   wherein the hardware module includes a printed circuit board and an L-shaped structure,
   wherein the printed circuit board includes at least one lighting element,
   wherein a first end of the L-shaped structure is placed on the at least one lighting element,
   wherein a second end of the L-shaped structure is fed through an attachment opening in the mounting element and through a viewing opening in the front panel, and
   wherein the L-shaped structure is made of a transparent medium.

2. Housing according to claim 1, wherein a labeling element is attached to the mounting element and has a head portion and a body portion and wherein the body portion is inserted into another attachment opening within the mounting element of the hardware module and/or wherein at least one part of the labeling element is the head portion.

3. Housing according to claim 2,
   wherein the body portion and the another attachment opening of the mounting element each have a screw thread and are screwed together and wherein the another attachment opening is a through hole or a blind hole.

4. Housing according to claim 2,
   wherein the another attachment opening is a through hole and a part of the body portion extends out of a first end of the another attachment opening,
   wherein the first end is an end that is farther away from the head portion than from the body portion and wherein this part of the body portion is riveted with the mounting element.

5. Housing according to claim 2,
   wherein the another attachment opening is a through hole and a part of the body portion extends out of a first end of the another attachment opening,
   wherein the first end is an end that is farther away from the head portion than from the body portion, wherein at least this part of the body portion has a screw thread, and wherein a nut attaches this part of the body portion to the mounting element.

6. Housing according to claim 2,
   wherein the labeling element has a middle portion between the head portion and the body portion,
   wherein a diameter of the middle portion is larger than a diameter of the head portion and/or the body portion, and/or
   wherein a cross section of the middle portion is a hexagon or an octagon for fitting into a ring wrench.

7. Housing according to claim 2,
   wherein the front panel includes at least one viewing opening, and
   wherein the head portion fits into the at least one viewing opening and is flush with the front panel.

8. Housing according to claim 2,
   wherein the labeling element is made in one piece by a milling process or a pressing process.

9. Housing according to claim 1,
   wherein the housing includes a plurality of hardware modules,
   wherein at least some of the hardware modules are of a different type,
   wherein labeling elements within the hardware modules of a same type have a same color and shape, and
   wherein the labeling elements within the hardware modules of a different type differ in color and/or shape from each other.

10. Housing according to claim 1,
    wherein the front panel includes another viewing opening.

* * * * *